US010405419B2

(12) United States Patent
Awaji (10) Patent No.: US 10,405,419 B2
(45) Date of Patent: Sep. 3, 2019

(54) WIRING SUBSTRATE AND METHOD FOR MANUFACTURING SAID WIRING SUBSTRATE (71) Applicant: FUJIKURA LTD., Tokyo (JP)

(72) Inventor: Daisuke Awaji, Sakura (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 16/307,649

(22) PCT Filed: May 1, 2017

(86) PCT No.: PCT/JP2017/017190
§ 371 (c)(1),
(2) Date: Dec. 6, 2018

(87) PCT Pub. No.: WO2018/029920
PCT Pub. Date: Feb. 15, 2018

(65) Prior Publication Data
US 2019/0191553 A1 Jun. 20, 2019

(30) Foreign Application Priority Data

Aug. 12, 2016 (JP) .................... 2016-158621

(51) Int. Cl.
H05K 1/02 (2006.01)
H05K 1/18 (2006.01)
(Continued)

(52) U.S. Cl.
CPC ......... H05K 1/0277 (2013.01); H05K 1/0298 (2013.01); H05K 1/0353 (2013.01);
(Continued)

(58) Field of Classification Search
CPC .... H05K 1/0277; H05K 1/0271; H05K 1/028; H05K 1/0281; H05K 1/0284; H05K 1/119; H05K 2201/068
See application file for complete search history.

(56) References Cited

U.S. PATENT DOCUMENTS 3,930,115 A * 12/1975 Uden ...................... H01L 23/13
174/16.3
4,413,308 A * 11/1983 Brown ................. H05K 1/0271
257/734
(Continued)

FOREIGN PATENT DOCUMENTS

JP 1-255286 A 10/1989
JP 9-23052 A 1/1997
(Continued)

OTHER PUBLICATIONS

International Search Report dated Aug. 1, 2017, issued in counterpart International Application No. PCT/JP2017/017190 (1 page).

Primary Examiner — Hoa C Nguyen
(74) Attorney, Agent, or Firm — Westerman, Hattori, Daniels & Adrian, LLP (57) ABSTRACT An embodiment of the present invention provides a wiring substrate which allows bending of the wiring substrate to be carried out concurrently with reflow for mounting an electronic component to the wiring substrate. A component-mounted body (1) of an embodiment of the present invention includes a wiring substrate (10) and at least one bend assisting body (30) which is belt-like and formed on the wiring substrate (10). The wiring substrate (10) is bent so that a straight bending line is formed along a direction in which the at least one bend assisting body (30) extends. This forms, in the wiring substrate (10), a depressed portion (14) which can contain an IC chip (20).

9 Claims, 7 Drawing Sheets (51) Int. Cl.
*H05K 3/34* (2006.01)
*H05K 1/03* (2006.01)
*H05K 3/46* (2006.01)

(52) U.S. Cl.
CPC ............ *H05K 1/181* (2013.01); *H05K 3/341* (2013.01); *H05K 3/4691* (2013.01)

(56) References Cited

U.S. PATENT DOCUMENTS

| | | | |
|---|---|---|---|
| 5,028,473 A * | 7/1991 | Vitriol | H01L 21/4857 156/89.12 |
| 5,600,179 A * | 2/1997 | Suzuki | H01L 23/3121 257/690 |
| 6,417,027 B1 | 7/2002 | Akram | |
| 2002/0079575 A1* | 6/2002 | Hozoji | H01L 23/49816 257/734 |
| 2007/0034402 A1* | 2/2007 | Cheng | G02F 1/13452 174/260 |
| 2009/0032295 A1* | 2/2009 | Okajima | H05K 1/0203 174/260 |
| 2012/0250326 A1* | 10/2012 | Sekine | H01L 25/0753 362/249.08 |
| 2014/0306250 A1* | 10/2014 | Gardner | H01L 25/0753 257/89 |
| 2015/0062525 A1* | 3/2015 | Hirakata | G02F 1/133305 349/158 |
| 2015/0366054 A1* | 12/2015 | Okasaka | B32B 15/08 361/783 |
| 2016/0159970 A1* | 6/2016 | Green | C08G 59/5013 525/523 |
| 2018/0084644 A1* | 3/2018 | Matsuda | H05K 1/028 |

FOREIGN PATENT DOCUMENTS

| | | |
|---|---|---|
| JP | 2004-63691 A | 2/2004 |
| JP | 2004-82564 A | 3/2004 |
| JP | 2006-165389 A | 6/2006 |

\* cited by examiner

WIRING SUBSTRATE AND METHOD FOR MANUFACTURING SAID WIRING SUBSTRATE

TECHNICAL FIELD

The present invention relates to a wiring substrate and a method of producing the wiring substrate.

BACKGROUND ART

Patent Literature 1 discloses an electronic device in which an electronic component is provided to a depressed portion of a supporting body made of a liquid crystal polymer. Containing the electronic component in the depressed portion of the support is advantageous in that it makes it possible to prevent the electronic component from become a hindrance to mounting the support body to another support body (i.e., secondary mounting). Furthermore, liquid crystal polymer has excellent electrical properties, size stability, and heat resistance, and a layer of metal such as copper foil can be provided directly thereto via heating. This allows the liquid crystal polymer to be suitably used as a substrate for an electronic circuit.

Figure 9:
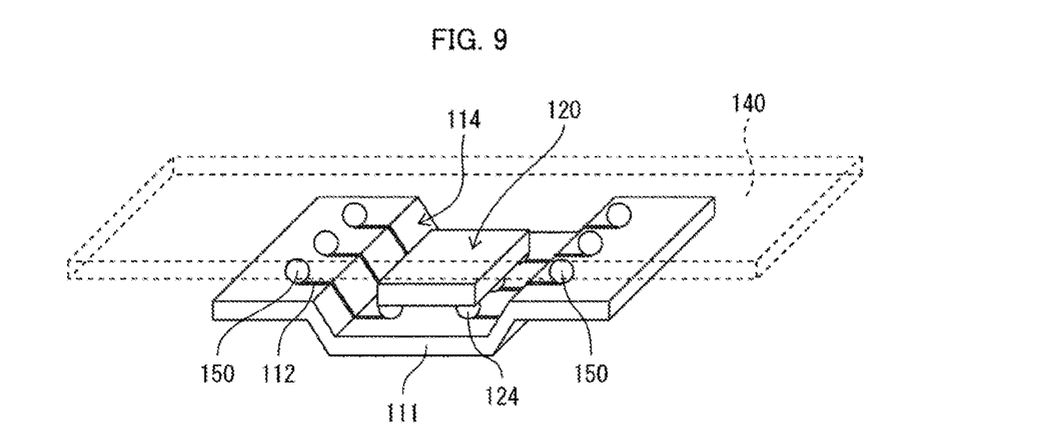
FIG. 9 is a diagram for explaining a conventional configuration.

A more detailed description of a component-mounted body obtained as a result of secondary mounting is as follows (such a body is hereinafter referred to as a "secondary component-mounted body"). FIG. 9 is a perspective view of an example of a secondary component-mounted body. Note that in FIG. 9, for convenience, a substrate for secondary mounting is depicted as a transparent member. As illustrated in FIG. 9, a substrate 111 for primary mounting has a depressed portion 114, in which an electronic component 120 is contained. Terminals of the electronic component 120 are connected via soldering 124, to first ends of wiring 112 provided to the substrate 111 for primary mounting. Second ends of the wiring 112 are connected, via soldering 150, to terminals (not shown) of a substrate 140 for secondary mounting.

Figure 10:
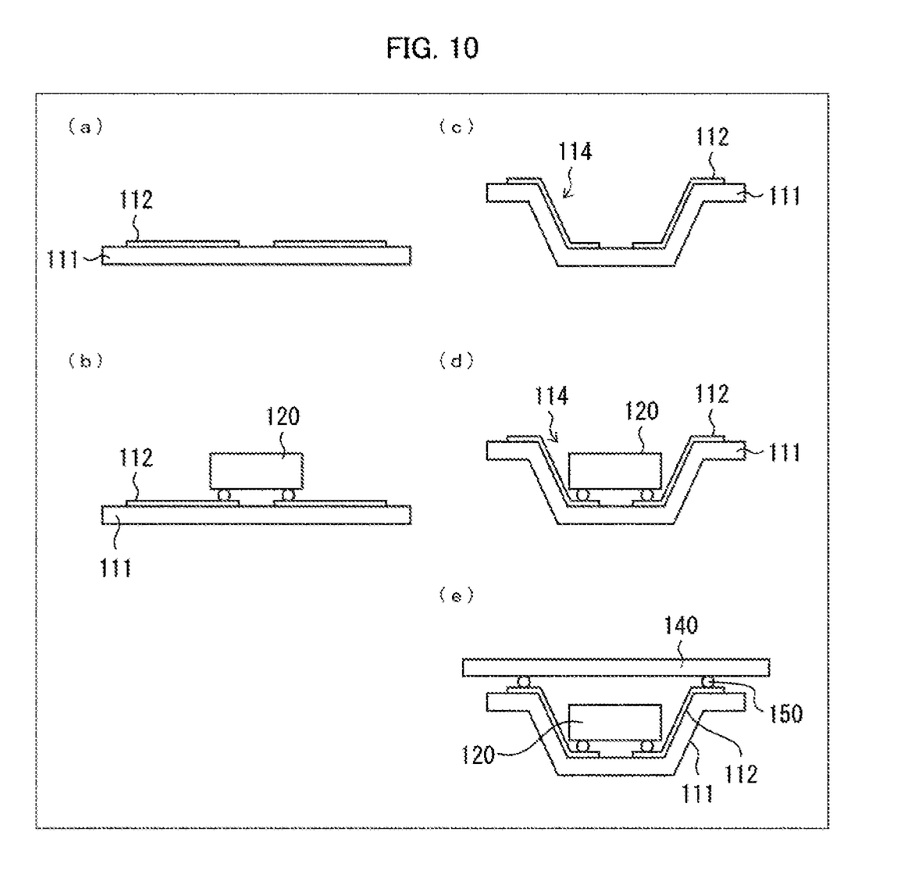
FIG. 10 is a diagram for explaining a conventional configuration.

Discussed next, with reference to FIG. 10, is a typical process of producing the secondary component-mounted body illustrated FIG. 9. FIG. 10 is a side view of an electronic component, a substrate for primary mounting, and a substrate for secondary mounting. There are two general types of production processes involving the steps illustrated in FIG. 10. The first type of production process is as follows. The substrate 111 for primary mounting begins in the state illustrated in (a) of FIG. 10, in which a depressed portion has not yet been formed. The electronic component 120 is placed on this substrate 111, and terminals of the electronic component 120 are electrically connected to the wiring 112 of the substrate 111 ((b) of FIG. 10). The substrate 111 is then bent so as to form the depressed portion 114 which contains the electronic component 120 ((d) of FIG. 10). Finally, the substrate 111 for primary mounting is electrically connected to the substrate 140 for secondary mounting ((e) of FIG. 10), and the secondary component-mounted body is completed. The second type of production process is as follows. The substrate 111 for primary mounting begins in the state illustrated in (a) of FIG. 10, in which a depressed portion has not yet been formed. Before the electronic component 120 is mounted to the substrate 111, the substrate 111 is bent so that the depressed portion 114 is formed ((c) of FIG. 10). Thereafter, the electronic component 120 is placed so as to be contained in the depressed portion 114, and terminals of the electronic component 120 are electrically connected to the wiring of the substrate 111 ((d) of FIG. 10). Finally, connection terminals of substrate 111 for primary mounting are electrically connected to connection terminals of the substrate 140 for secondary mounting ((e) of FIG. 10), and the secondary component-mounted body is completed.

CITATION LIST

Patent Literature

[Patent Literature 1]
Japanese Patent Application Publication, Tokukai, No. 2004-82564 (Publication Date: Mar. 18, 2004)

SUMMARY OF INVENTION

Technical Problem

With such a conventional production method, it is necessary to carry out an operation to bend the substrate either before or after the operation to mount the electronic component to the substrate, as illustrated in FIG. 10.

In the first type of production process described above, the substrate is bent after the electronic component is mounted thereto. As such, there is a risk that a worker, an instrument used by a worker, or the like will make contact with the electronic component during the operation to bend the substrate and result in a faulty connection. In the second type of production process described above, the substrate is bent before the electronic component is mounted thereto. In this case, it is necessary to mount the electronic component to a bent substrate. This increases the difficulty of the operation for mounting the electronic component and increases the likelihood of a faulty connection stemming from an error in the mounting operation.

An embodiment of the present invention is accomplished in view of the above problems. An object of an embodiment of the present invention lies in providing (i) a wiring substrate which allows bending of the wiring substrate to be carried out concurrently with reflow for mounting an electronic component to the wiring substrate, and (ii) a method of producing such a wiring substrate.

Solution to Problem

In order to solve the above-described problems, a wiring substrate in accordance with an aspect of the present invention (which wiring substrate is also referred to as a first wiring substrate) includes:

a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

wiring formed on the substrate; and at least one bend assisting body which extends in a belt-like manner parallel to the first axis of the substrate surface, a difference between (i) a thermal expansion coefficient of the at least one bend assisting body and (ii) the second thermal expansion coefficient of the substrate being greater than a difference between (i) the thermal expansion coefficient of the at least one bend assisting body and (ii) the first thermal expansion coefficient of the substrate, the substrate being bent along with each of the at least one bend assisting body so as to form a bending line which extends parallel to the first axis.

In order to solve the above-described problems, another wiring substrate in accordance with an aspect of the present invention (which wiring substrate is also referred to as a second wiring substrate) includes:

a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

wiring formed on the substrate; and at least one bend assisting body which extends in a belt-like manner parallel to the second axis of the substrate surface, a difference between (i) a thermal expansion coefficient of the at least one bend assisting body and (ii) the first thermal expansion coefficient of the substrate being greater than a difference between (i) the thermal expansion coefficient of the at least one bend assisting body and (ii) the second thermal expansion coefficient of the substrate, the substrate being bent along with each of the at least one bend assisting body so as to form a bending line which extends parallel to the second axis.

A method of producing a wiring substrate in accordance with an aspect of the present invention (which method is also referred to as a first method of producing a wiring substrate) includes the steps of:

forming wiring on a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

forming, on the substrate, at least one bend assisting body which extends in a belt-like manner parallel to the first axis of the substrate surface, the at least one bend assisting body having a thermal expansion coefficient such that a difference between (i) the thermal expansion coefficient of the at least one bend assisting body and (ii) the second thermal expansion coefficient of the substrate is greater than a difference between (i) the thermal expansion coefficient of the at least one bend assisting body and (ii) the first thermal expansion coefficient of the substrate; and heating the substrate and the bend assisting body after the step of forming the at least one bend assisting body, such that the substrate is bent along with each of the at least one bend assisting body so as to form a bending line which extends parallel to the first axis.

In order to solve the above-described problems, another method of producing a wiring substrate in accordance with an aspect of the present invention (which method is also referred to as a second method of producing a wiring substrate) includes the steps of:

forming wiring on a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

forming, on the substrate, at least one bend assisting body which extends in a belt-like manner parallel to the second axis of the substrate surface, the at least one bend assisting body having a thermal expansion coefficient such that a difference between (i) the thermal expansion coefficient of the at least one bend assisting body and (ii) the first thermal expansion coefficient of the substrate is greater than a difference between (i) the thermal expansion coefficient of the at least one bend assisting body and (ii) the second thermal expansion coefficient of the substrate; and heating the substrate and the bend assisting body after the step of forming the at least one bend assisting body, such that the substrate is bent along with each of the at least one bend assisting body so as to form a bending line which extends parallel to the second axis.

Advantageous Effects of Invention

An embodiment of the present invention makes it possible to provide a wiring substrate which allows bending of the wiring substrate to be carried out concurrently with reflow for mounting an electronic component to the wiring substrate.

DESCRIPTION OF EMBODIMENTS

Embodiment 1

The following description will discuss a wiring substrate and a method of producing the wiring substrate in accordance with an embodiment of the present invention.

Note that in the following descriptions, the term "component-mounted body" is used to refer to a body including a wiring substrate and an IC chip (one type of electronic component) mounted to the wiring substrate. Furthermore, in the following descriptions, the electronic component (IC chip) and a bend assisting body are discussed as being elements which are separate from the wiring substrate. However, the term "wiring substrate" may be used to refer to (i) a wiring substrate which includes a bend assisting body and (ii) a wiring substrate which includes a bend assisting body and an electronic component (IC chip).

(Component-Mounted Body)

Figure 1:
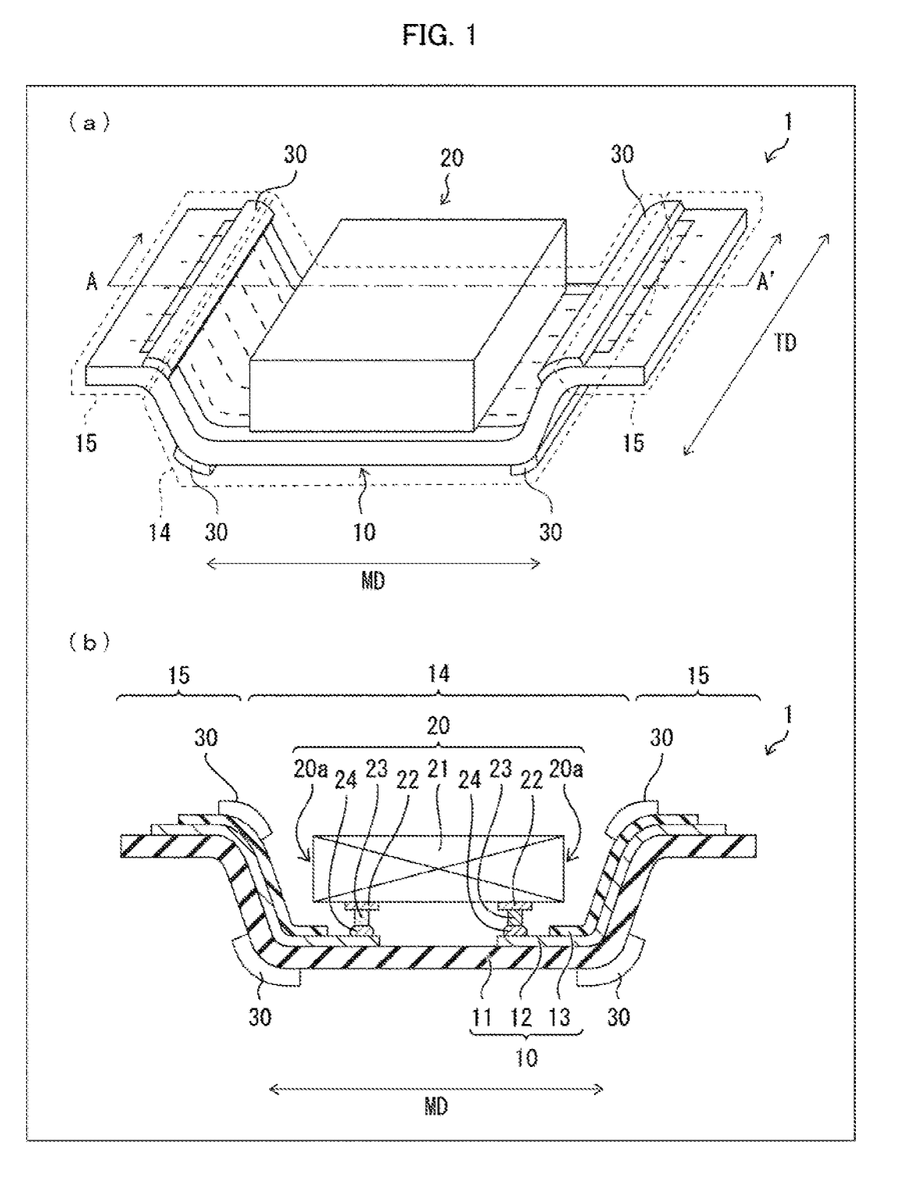
FIG. 1 is a diagram schematically illustrating a configuration of a component-mounted body in accordance with an embodiment of the present invention. (a) of FIG. 1 is a perspective view of the component-mounted body. (b) of FIG. 1 is a cross-sectional view taken along a line A-A' as appears in (a) of FIG. 1.

FIG. 1 is a diagram schematically illustrating a configuration of a component-mounted body 1 (wiring substrate) in accordance with Embodiment 1. (a) of FIG. 1 is a perspective view of the component-mounted body 1. (b) of FIG. 1 is a cross-sectional view taken along a line A-A' as appears in (a) of FIG. 1. For ease of explanation, a substrate for secondary mounting is not shown in FIG. 1.

As illustrated in (a) of FIG. 1, the component-mounted body 1 in accordance with Embodiment 1 includes a wiring substrate 10, an IC chip 20 (electronic component), and bend assisting bodies 30. The wiring substrate 10 includes step-like portions so as to have a three-dimensional structure. Specifically, a depressed portion 14 is provided in a central part of an upper surface of the wiring substrate 10. The IC chip 20 is mounted in the depressed portion 14, to a bottom of the depressed portion 14, via flip chip mounting. More specifically, the step-like portions of the wiring substrate 10 are positioned so as to be opposite to lateral surfaces 20a of the IC chip 20 (see (b) of FIG. 1), which lateral surfaces 20a extend parallel to a TD axis as illustrated in (a) of FIG. 1.

Wiring Substrate 10

As illustrated in (b) of FIG. 1, the wiring substrate 10 includes a liquid crystal polymer (LCP) base material 11, a substrate wiring layer 12 (wiring) provided on an upper surface of the LCP base material 11, and a passivation layer 13 provided over the upper surface of the LCP base material 11 so as to cover part of the substrate wiring layer 12. In the descriptions below, a surface of the wiring substrate 10 on a side having the substrate wiring layer 12 and the passivation layer 13 is referred to as an upper surface, and a surface of the wiring substrate 10 on a side facing away from the upper surface is referred to as a lower surface.

The upper surface (substrate surface) of the LCP base material 11 is quadrangular when the LCP base material 11 is flat. However, as illustrated in (a) of FIG. 1, providing the step-like portions to the LCP base material 11 gives the LCP base material 11 a three-dimensional structure, in which the depressed portion 14 is formed in the central part of the upper surface. The upper surface of the LCP base material 11 includes the depressed portion 14 and two adjacent portions 15 which sandwich and are adjacent to the depressed portion 14 along an MD axis. In other words, a first one of the adjacent portions 15, the depressed portion 14, and a second one of the adjacent portions 15 are arranged in this order along the MD axis. The LCP base material 11 has a three-dimensional structure such that, in the above order along the MD axis, the LCP base material 11 is (i) contoured downwardly from the first one of the adjacent portions 15 to the bottom of the depressed portion 14 and (ii) contoured upwardly from the bottom of the depressed portion 14 to the second one of the adjacent portions 15. Note that the terms "depressed portion 14" and "adjacent portions 15" may also be used to refer to the positions of the depressed portion 14 and the adjacent portions 15 on the wiring substrate 10.

The LCP base material 11 is thermoplastic and has a thermal expansion coefficient which is anisotropic in the plane of the upper surface of the LCP base material 11. Specifically, a thermal expansion coefficient of the LCP base material 11 along a transverse direction (TD; perpendicular direction) axis (first axis) shown in (a) of FIG. 1 is greater than a thermal expansion coefficient of the LCP base material 11 along a machine direction (MD; flow direction) axis (second axis). For example, along the TD axis shown in (a) of FIG. 1, the LCP base material 11 has a thermal expansion coefficient of approximately $5.0 \times 10^{-5}/^\circ$ C. to $10.0 \times 10^{-5}/^\circ$ C., and along the MD axis shown in (a) of FIG. 1, the LCP base material 11 has a thermal expansion coefficient of approximately $0.001 \times 10^{-5}/^\circ$ C. to $2.0 \times 10^{-5}/^\circ$ C.

Examples of a material for the LCP base material 11 include: a polycondensate of ethylene terephthalate and para-hydroxybenzoate; a polycondensate of (i) phenol and/or phthalic acid and (ii) para-hydroxybenzoate; and a polycondensate of 2,6-hydroxynaphthoic acid and para-hydroxybenzoate. A material for the LCP base material 11 is not, however, limited to these examples.

The substrate wiring layer 12 constitutes a plurality of wires, each of which extends from (i) a vicinity of one of the two ends of the upper surface of the LCP base material 11, which ends extend parallel to the TD axis shown in (a) of FIG. 1, toward (ii) the bottom of the depressed portion 14. As illustrated in (b) of FIG. 1, each of the plurality of wires has a first end which is exposed at the bottom of the depressed portion 14 and a second end which is exposed at one of the adjacent portions 15. The number of wires which the substrate wiring layer 12 constitutes is not limited to that illustrated in (a) of FIG. 1.

The passivation layer 13 is formed so as to cover an intermediate portion of each of the wires constituted by the substrate wiring layer 12 (a portion which excludes the ends of each wire).

Note that in Embodiment 1, the LCP base material 11 is film-like and flexible. Even in a state where the substrate wiring layer 12 and the passivation layer 13 are provided on the LCP base material 11 (i.e., in a state where the wiring substrate 10 is formed), the LCP base material 11 maintains the flexibility and the above-described anisotropy of the LCP base material 11.

IC Chip 20

The IC chip 20 is an electronic component which is contained in the depressed portion 14 of the wiring substrate 10. Note that the IC chip 20 is completely contained in the depressed portion 14. In other words, a height of a top end of the IC chip 20 is approximately equal to the height of the adjacent portions 15. As such, in a case where mounting (so-called secondary mounting) is carried out by using solder to connect (i) terminals of the substrate wiring layer 12 (wiring/wires), which are provided to the adjacent portions 15 to (ii) wiring of a substrate for secondary mounting, the IC chip 20 does not hinder the mounting.

As illustrated in (b) of FIG. 1, the IC chip 20 has (i) a semiconductor base material 21 having a quadrangular shape, (ii) I/O pads 22 provided to a back surface of the semiconductor base material 21, the I/O pads 22 being terminals of an MMIC, (iii) Cu pillars 23 provided to the back surface of the semiconductor base material 21, and (iv) a solder layer 24 provided at tips of the Cu pillars 23. The I/O pads 22 and the Cu pillars 23 are provided to peripheral portions of the back surface of the quadrangular-shaped semiconductor base material 21 (for example, in a peripheral arrangement) so as to each be located in a position facing a respective one of connection terminals of the substrate wiring layer 12 (wiring/wires), which connection terminals are exposed at the bottom of the depressed portion 14 of the wiring substrate 10. Note that an integrated circuit (IC) of the IC chip 20 may be a well-known high-frequency IC other than the MMIC, or may be any well-known IC without being restricted to a high-frequency one.

Bend Assisting Body 30

As illustrated in (a) of FIG. 1, each of the bend assisting bodies 30 is a belt-like layer extending parallel to the TD axis. The bend assisting bodies 30 are provided at a total of four positions, i.e., two positions on the upper surface of the wiring substrate 10, and two positions on the lower surface of the wiring substrate 10.

More specifically, each of the bend assisting bodies 30 is provided at a portion of the wiring substrate 10 that is bent. The portions of the wiring substrate that are bent are (i) boundary portions at a boundary between (a) the depressed portion 14 and (b) each of the adjacent portions 15 and (ii) boundary portions at a boundary between (a) the bottom portion of the depressed portion 14 and (b) each of the side portions of the depressed portion 14. At the boundary portions between the depressed portion 14 and each of the adjacent portions 15, the wiring substrate 10 is bent along a line extending parallel to the TD axis so that the upper surface of the wiring substrate 10 is on an outer side (convex side) of the bend. At the boundary portions between the bottom portion and each of the side portions of the depressed portion 14, the wiring substrate 10 is bent along a line extending parallel to the TD axis so that the lower surface of the wiring substrate 10 is on an outer side of the bend. The bend assisting bodies 30 are provided so as to each cover the outer side of one of the bends. In other words, at the boundary portions between the depressed portion 14 and each one of the adjacent portions 15, the bend assisting bodies 30 are provided to the upper surface of the wiring substrate 10, and at the boundary portions between the bottom portion and each of the side portions of the depressed portion 14, the bend assisting bodies 30 are provided to the lower surface of the wiring substrate 10.

Figure 2:
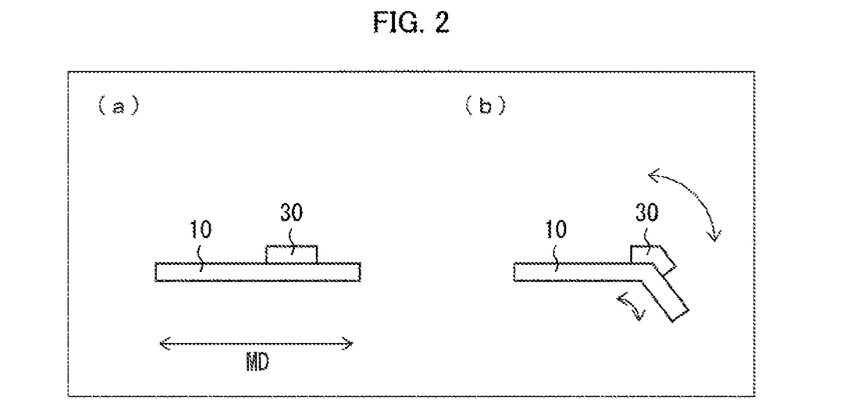
FIG. 2 is a lateral view of a portion of the component-mounted body illustrated in FIG. 1. (a) of FIG. 2 illustrates the component-mounted body prior to heating. (b) of FIG. 2 illustrates the component-mounted body after heating.

The following description will discuss the bend assisting bodies 30 in detail, with reference to FIG. 2. FIG. 2 is a side view illustrating one portion of the wiring substrate 10 and one of the bend assisting bodies 30, as viewed from the same direction as in (b) of FIG. 1.

The LCP base material 11 (see FIG. 1), which is thermoplastic, serves as the base of the wiring substrate 10. Heating the wiring substrate 10 therefore causes the wiring substrate 10 to expand in accordance with the thermal expansion coefficients of the LCP base material 11. In Embodiment 1, the bend assisting bodies 30 are made from a material which has a thermal expansion coefficient that is greater than the thermal expansion coefficient of the LCP base material 11 along the MD axis.

(a) of FIG. 2 illustrates the wiring substrate 10 and one of the bend assisting bodies 30 in a state prior to heating. When the wiring substrate 10 and the bend assisting body 30 are heated, the bend assisting body 30 undergoes a greater degree of MD axis-wise expansion than does the wiring substrate 10, due to the difference between the thermal expansion coefficient of the bend assisting body 30 and the thermal expansion coefficient of the wiring substrate 10 along the MD axis. This causes the wiring substrate 10 to bend such that a side on which the bend assisting body 30 is not provided is on the inner side (concave side) of the bend, and a side having the bend assisting body 30 is on the outer side of the bend (see (b) of FIG. 2).

In other words, the bend assisting body 30 causes the previously flat wiring substrate 10 to bend such that the above-described three-dimensional structure is formed.

Note that in the present specification, the word "bend" encompasses both (i) sharp bending and (ii) curving.

More specifically, the bend assisting bodies 30 have a thermal expansion coefficient which is (i) greater than the thermal expansion coefficient of the LCP base material 11 along the MD axis and (ii) approximately equal to the thermal expansion coefficient of the LCP base material 11 along the TD axis.

In other words, the following relational expression holds true.

(thermal expansion coefficient of LCP base material 11 along MD axis)<(thermal expansion coefficient of LCP base material 11 along TD axis)≈(thermal expansion coefficient of bend assisting bodies 30)

Note that the thermal expansion coefficient of the bend assisting bodies 30 is isotropic.

With the above thermal expansion coefficients, the wiring substrate 10 is not deformed with respect to the TD axis because the bend assisting bodies 30 and the wiring substrate 10 have approximately equal thermal expansion coefficients along the TD axis. However, the bend assisting bodies 30 cause the wiring substrate 10 to be deformed with respect to the MD axis because the bend assisting bodies 30 have a thermal expansion coefficient which is greater than that of the wiring substrate 10 along the MD axis. Specifically, at each position where one of the bend assisting bodies 30 is provided, the wiring substrate 10 is bent so as to form a straight "bending line" parallel to the TD axis, the bend assisting bodies 30 being on an outer side of each bend.

Figure 3:
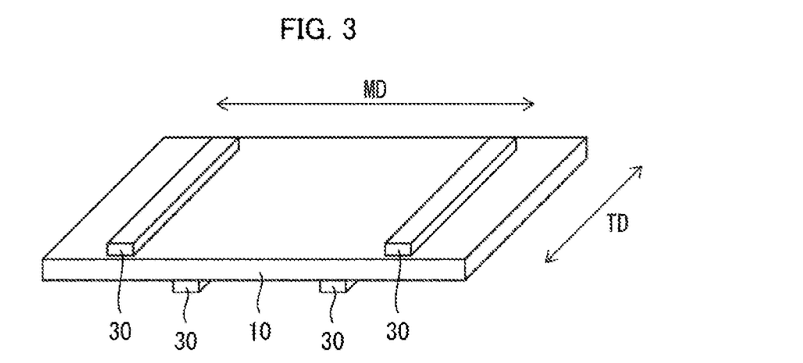
FIG. 3 is a perspective view of a portion of the component-mounted body illustrated in FIG. 1.

FIG. 3 is a perspective view of the wiring substrate 10 in a flat state, with the bend assisting bodies 30 being provided to the wiring substrate 10. As illustrated in FIG. 3, on the wiring substrate 10 in a flat state, each of the bend assisting bodies 30 is provided at a position at which the wiring substrate 10 is to bend, such that each of the bend assisting bodies 30 will be on an outer side of each bend. Each of the bend assisting bodies 30 extends in a belt-like manner parallel to the TD axis so as to span an entire TD axis-wise dimension of the wiring substrate 10.

Providing the bend assisting bodies 30 in this manner makes it possible to form the depressed portion 14 and the adjacent portions 15 of the wiring substrate 10 by use of heating. This will be described later.

Examples of a material for the bend assisting bodies 30 include resin and metal. Examples of resins which can be used include epoxy resin (thermal expansion coefficient of $2 \times 10^{-5}$ to $6.5 \times 10^{-5}$) and acrylic resin (thermal expansion coefficient of $4.5 \times 10^{-5}$ to $7.0 \times 10^{-5}$). Examples of metals which can be used include aluminum (thermal expansion coefficient of $23.0 \times 10^{-5}$), copper (thermal expansion coefficient of $16.8 \times 10^{-5}$), and gold (thermal expansion coefficient of $14.3 \times 10^{-5}$).

Note that a greater difference between the respective thermal expansion coefficients of the LCP base material 11 and the bend assisting bodies 30 will lead to a greater degree of bending when the LCP base material 11 and the bend assisting bodies 30 are heated. It is therefore possible to change the degree of bending by adjusting the difference between these thermal expansion coefficients.

[Method of Producing Component-Mounted Body]

Figure 4:
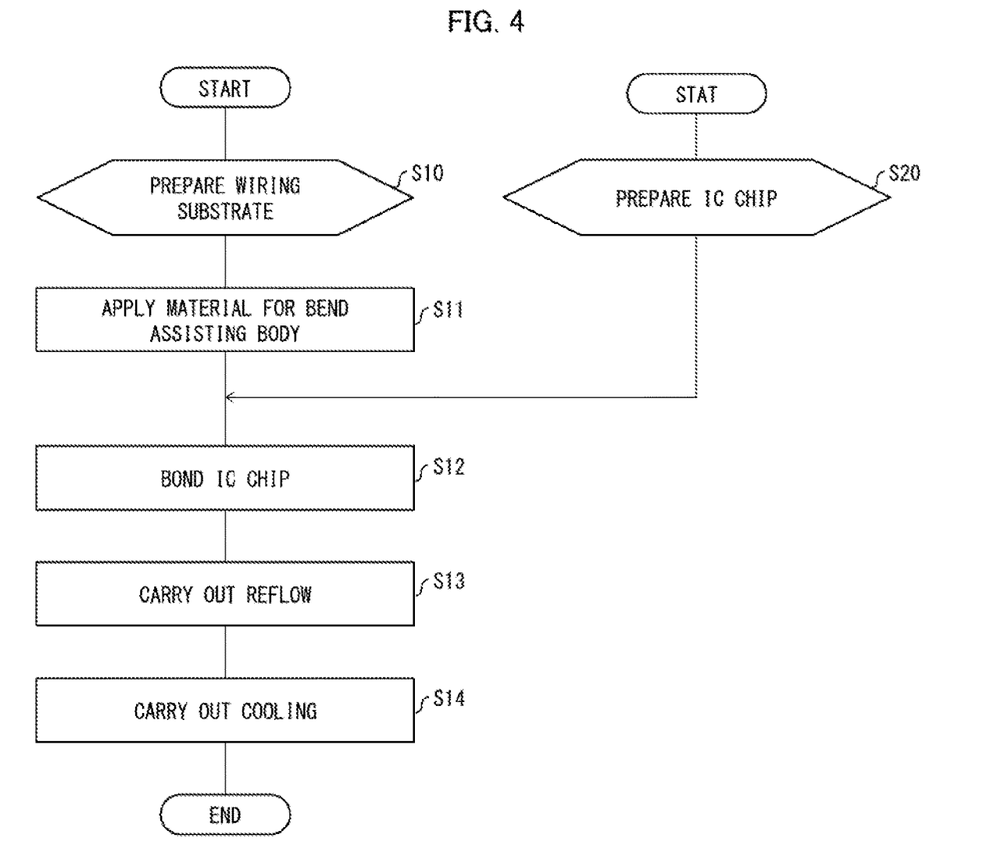
FIG. 4 is a flowchart illustrating a method for manufacturing the component-mounted body illustrated in FIG. 1.
Figure 5:
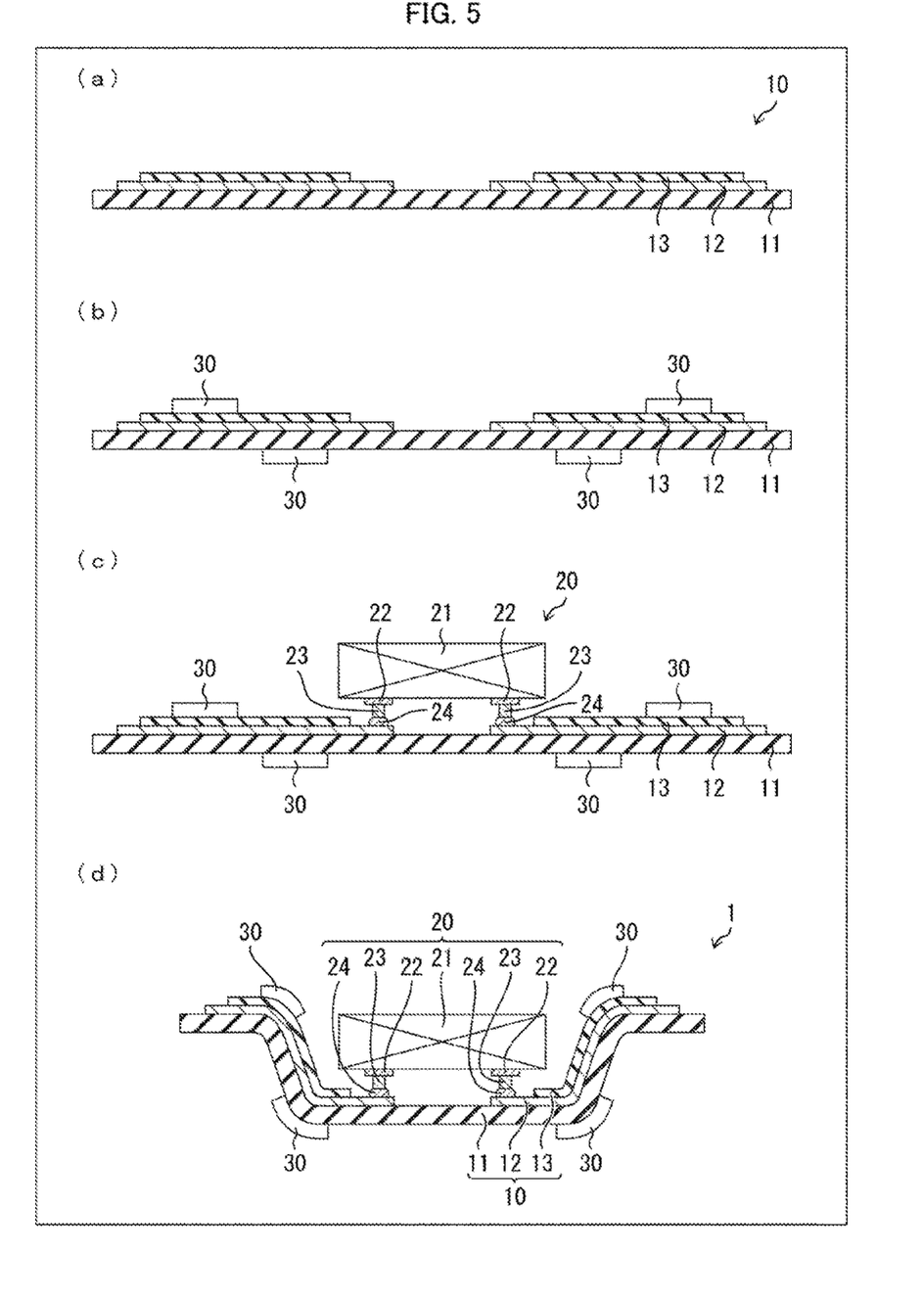
FIG. 5 is a diagram for explaining steps of producing the component-mounted body illustrated in FIG. 1.

The following description will discuss, with reference to FIGS. 4 and 5, a method of producing the component-mounted body 1 in accordance with Embodiment 1. FIG. 4 is a flowchart showing a method of producing the component-mounted body 1 illustrated in FIG. 1. FIG. 5 is a cross-sectional view for explaining steps of the method of producing the component-mounted body as shown in FIG. 4. Each of (a) through (d) of FIG. 5 is a cross-sectional view of the wiring substrate 10 (LCP base material 11) and the like, as viewed from the same direction as in (b) of FIG. 1.

First, the wiring substrate 10 is prepared (FIG. 4: step S10, wiring forming step). Specifically, the substrate wiring layer 12 (e.g., Cu/Ni/Au) is formed on the upper surface of the LCP base material 11 by a method such as plating. The substrate wiring layer 12 constitutes (i) a wiring part, (ii) pads for connecting the IC chip, and (iii) I/O pads to be connected with, for example, wiring and another substrate. Further, the passivation layer 13 is formed on the upper surface of the LCP base material 11 so as to cover the wiring part of the substrate wiring layer 12, which wiring part is not used for connection to an external element. This state is illustrated in (a) of FIG. 5.

Next, the bend assisting bodies 30 are formed on the upper and lower surfaces of the wiring substrate 10 in a belt-like manner so that a longitudinal direction of the bend assisting bodies 30 is parallel to the TD axis (FIG. 4: step S11, bend assisting body forming step). The bend assisting bodies 30 are formed at positions as described above. The bend assisting bodies 30 formed on the upper surface of the wiring substrate 10 are provided above the substrate wiring layer 12 and the passivation layer 13. However, because the substrate wiring layer 12 and the passivation layer 13 are thin, they do not hinder bending of the LCP base material 11. Examples of a method of forming the bend assisting bodies 30, which are belt-like, include application with use of a dispenser, application by an inkjet method, and application by printing.

The IC chip 20 illustrated in (c) of FIG. 5 is prepared (FIG. 4: step S20). Specifically, the IC chip 20 which is prepared has (i) the MMIC (not illustrated) provided on the back surface of the semiconductor base material 21, (ii) the I/O pads 22, (iii) the Cu pillars 23 provided on the I/O pads 22 and having a height of, for example, 25 µm to 50 µm, and (iv) the solder layer 24 (e.g., SnAg solder) provided at the tip of the Cu pillars 23.

Next, to the upper surface of the wiring substrate 10 (on which the bend assisting bodies 30 were formed in step S11 of FIG. 4), the IC chip 20 (prepared in step S20 of FIG. 4) is bonded (FIG. 4: step S12, contact step). This state is illustrated in (c) of FIG. 5.

Subsequently, reflow is carried out in a heated atmosphere (FIG. 4: step S13, heating step). In the heated atmosphere, the solder layer 24 provided to the IC chip 20 melts so that the terminals of the IC chip 20 are connected via the solder to IC chip-side pads of the substrate wiring layer 12. Also, the wiring substrate 10 and the bend assisting bodies 30 bend so that the depressed portion 14 and the adjacent portions 15 are formed in the wiring substrate 10. At this time, the IC chip 20 becomes contained in the depressed portion 14. In other words, the formation of the depressed portion 14 happens concurrently with reflow. Note that the reflow may be carried out using heat from a stage on which the wiring substrate 10 is placed, or heat from a tool etc. holding the IC chip 20. This state is illustrated in (d) of FIG. 5.

Then, at a step S14 shown in FIG. 4, the heating is ended and cooling is performed (back to normal temperature) (cooling step). This causes the solder layer 24 to be cured so that the connection between the IC chip 20 and the substrate wiring layer 12 via soldering is completed. Because the LCP base material 11 is thermoplastic, it maintains the above-described three-dimensional structure even after being cooled. The bend assisting bodies 30 may deform somewhat due to the cooling.

In this way, the component-mounted body 1 in accordance with Embodiment 1 is completed.

In Embodiment 1, providing the bend assisting bodies 30 makes it possible to form the depressed portion 14 in the wiring substrate 10 during reflow so that the IC chip 20 is contained in the depressed portion 14. In comparison to conventional techniques, this makes it possible to simplify a process for mounting an IC chip and forming a depressed portion in a wiring substrate. This simplification makes it possible to reduce, in comparison to conventional techniques, factors which can lead to faulty connections with the IC chip.

In the production method in accordance with Embodiment 1, the bend assisting bodies 30 are provided to the wiring substrate 10 before the IC chip 20 is bonded to the wiring substrate 10. Note, however, that the present invention is not limited to such a configuration. The bend assisting bodies 30 may be provided after the IC chip is bonded or simultaneously with the bonding of the IC chip.

When secondary mounting is to be carried out, the component-mounted body 1 illustrated in (d) of FIG. 5 is first bonded to the wiring substrate for secondary mounting such that the substrate wiring layer 12 side of the wiring substrate 10 faces the wiring substrate for secondary mounting, and then reflow is carried out. In this way, it is possible to produce a secondary component-mounted body.

[Variation 1]

In Embodiment 1, the bend assisting bodies 30 have a thermal expansion coefficient which is (i) greater than the thermal expansion coefficient of the LCP base material 11 along the MD axis and (ii) approximately equal to the thermal expansion coefficient of the LCP base material 11 along the TD axis. The present invention is not, however, limited to such a configuration.

For example, a configuration can be employed in which the thermal expansion coefficient of the bend assisting bodies 30 is (i) greater than the thermal expansion coefficient of the LCP base material 11 along the MD axis but (ii) smaller than the thermal expansion coefficient of the LCP base material 11 along the TD axis.

In other words, a configuration can be employed in which the following relational expression holds true.

(thermal expansion coefficient of LCP base material 11 along MD axis)<(thermal expansion coefficient of bend assisting bodies 30)<(thermal expansion coefficient of LCP base material 11 along TD axis)

However, in such a configuration, the following relational expression is to be satisfied.

|(thermal expansion coefficient of LCP base material 11 along MD axis)−(thermal expansion coefficient of bend assisting bodies 30)|>|(thermal expansion coefficient of LCP base material 11 along TD axis)−(thermal expansion coefficient of bend assisting bodies 30)|

With the above thermal expansion coefficients, the bend assisting bodies 30 bend due to the differences between (i) the thermal expansion coefficient of the bend assisting bodies 30 and (ii) the thermal expansion coefficients of the wiring substrate 10, along both of the TD axis direction and the MD axis direction. However, because the difference in the MD axis direction is greater than the difference in the TD axis direction, bending with respect to the MD axis direction becomes predominant. As such, it is possible to form, in the wiring substrate 10, a three-dimensional structure similar to that of Embodiment 1.

Furthermore, because a difference between the thermal expansion coefficients in the MD axis direction is smaller than in Embodiment 1, it is possible to reduce the degree of bending.

[Variation 2]

In Embodiment 1, the bend assisting bodies 30 have a thermal expansion coefficient which is (i) greater than the thermal expansion coefficient of the LCP base material 11 along the MD axis and (ii) approximately equal to the thermal expansion coefficient of the LCP base material 11 along the TD axis. The present invention is not, however, limited to such a configuration.

For example, a configuration can be employed in which the thermal expansion coefficient of the bend assisting bodies 30 is greater than both (i) the thermal expansion coefficient of the LCP base material 11 along the MD axis and (ii) the thermal expansion coefficient of the LCP base material 11 along the TD axis.

In other words, a configuration can be employed in which the following relational expression holds true.

(thermal expansion coefficient of LCP base material 11 along MD axis)<(thermal expansion coefficient of LCP base material 11 along TD axis)< (thermal expansion coefficient of bend assisting bodies 30)

With the above thermal expansion coefficients, the bend assisting bodies 30 bend due to the differences between (i) the thermal expansion coefficient of the bend assisting bodies 30 and (ii) the thermal expansion coefficients of the wiring substrate 10, along both of the TD axis direction and the MD axis direction. However, because the difference in the MD axis direction is greater than the difference in the TD axis direction, bending with respect to the MD axis direction becomes predominant. As such, it is possible to form, in the wiring substrate 10, a three-dimensional structure similar to that of Embodiment 1.

Furthermore, because a difference between the thermal expansion coefficients in the MD axis direction is greater than in Embodiment 1, it is possible to increase the degree of bending.

Embodiment 2

The component-mounted body in accordance with the present invention is not limited to the aspects discussed in Embodiment 1 and Variations 1 and 2 as illustrated in FIG. 1. The component-mounted body 1 illustrated in FIG. 1 is configured such that the bend assisting bodies 30 covers outer sides of bends in the wiring substrate 10. The component-mounted body may, however, be alternatively configured as described below.

Figure 6:
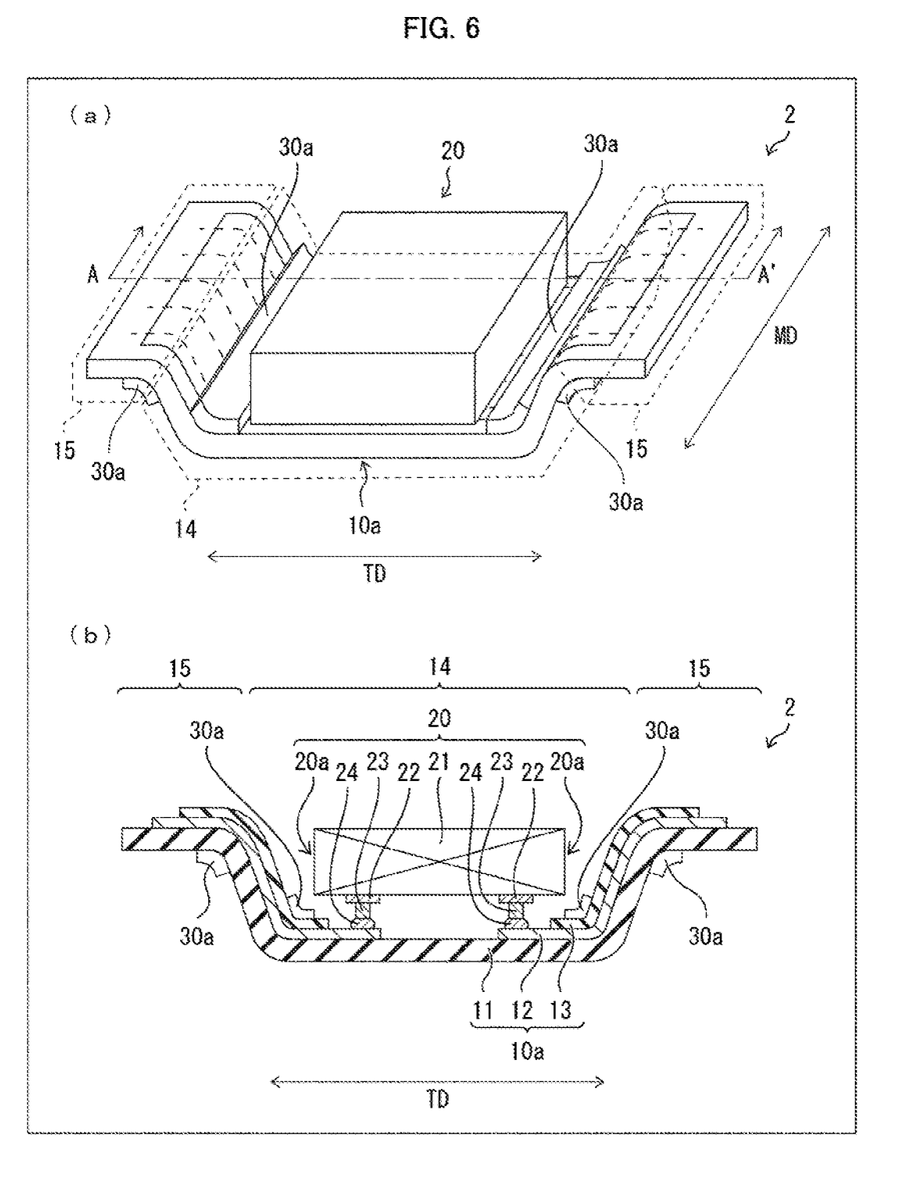
FIG. 6 is a diagram schematically illustrating a configuration of a component-mounted body in accordance with another embodiment of the present invention. (a) of FIG. 6 is a perspective view of the component-mounted body. (b) of FIG. 6 is a cross-sectional view taken along a line A-A' as appears in (a) of FIG. 6.

FIG. 6 is a diagram schematically illustrating a configuration of a component-mounted body 2 in accordance with Embodiment 2. (a) of FIG. 6 is a top view of the component-mounted body 2. (b) of FIG. 6 is a cross-sectional view taken along a line A-A' as appears in (a) of FIG. 6. For convenience, members having functions similar to those described in Embodiment 1 are given the same reference signs, and the descriptions of such members are omitted.

The component-mounted body 2 of Embodiment 2 as illustrated in FIG. 6 differs from the component-mounted body 1 of Embodiment 1 primarily with regards to the bend assisting bodies and the positions at which the bend assisting bodies are provided. In the component-mounted body 2 of Embodiment 2, bend assisting bodies 30a, which are belt-like, are provided so as to extend in a MD axis direction of the wiring substrate 10, as illustrated in (a) of FIG. 6.

It can be said that due to these bend assisting bodies 30a, an upper surface of a wiring substrate 10a has a depressed portion 14 and two adjacent portions 15 which sandwich and are adjacent to the depressed portion 14 along a TD axis. In other words, a first one of the adjacent portions 15, the depressed portion 14, and a second one of the adjacent portions 15 are arranged in this order along the TD axis. An LCP base material 11 has a three-dimensional structure such that, in the above order along the TD axis, the LCP base material 11 is (i) contoured downwardly from the first one of the adjacent portions 15 to the bottom of the depressed portion 14 and (ii) contoured upwardly from the bottom of the depressed portion 14 to the second one of the adjacent portions 15.

In Embodiment 2, the direction in which the belt-like bend assisting bodies extends differs from that of Embodiment 1 by 90°. As such, in Embodiment 2, a direction in which wiring (constituted by a substrate wiring layer 12) extends also differs from that of Embodiment 1 by 90°. In other words, the component-mounted body 2 of Embodiment 2 is configured such that wiring thereof extends in a TD axis direction, from (i) a vicinity of one of either ends of the LCP base material 11, which ends extend parallel to the MD axis, toward (ii) the bottom of the depressed portion 14 of the LCP base material 11, as illustrated in (b) of FIG. 6.

As illustrated in (a) of FIG. 6, each of the bend assisting bodies 30a is a belt-like layer extending parallel to the MD axis. The bend assisting bodies 30a are provided at a total of four positions, i.e., two positions on the upper surface of the wiring substrate 10a, and two positions on the lower surface of the wiring substrate 10a.

More specifically, at the boundary portions between the depressed portion 14 and each of the adjacent portions 15, the wiring substrate 10a is bent along a line extending parallel to the MD axis so that the upper surface of the wiring substrate 10a is on an outer side of the bend. At the boundary portions between the bottom portion and each of the side portions of the depressed portion 14, the wiring substrate 10a is bent along a line extending parallel to the MD axis so that the lower surface of the wiring substrate 10a is on an outer side of the bend. At boundary portions between the depressed portion 14 and each of the adjacent portions 15, the bend assisting bodies 30a are provided so as to cover a portion of a lower surface of the wiring substrate 10a. Each covered portion is on an inner side of a bend, and the upper surface of the wiring substrate 10a, which is on a reverse side, is on an outer side of the bend. At boundary portions between the bottom portion and each of the side portions of the depressed portion 14, the bend assisting bodies 30a are provided so as to cover a portion of the upper surface of the wiring substrate 10a, so that each covered portion is on an inner side of a bend.

In Embodiment 2, the bend assisting bodies 30a are made from a material which has a thermal expansion coefficient that is less than the thermal expansion coefficient of the LCP base material 11 along the TD axis.

Figure 7:
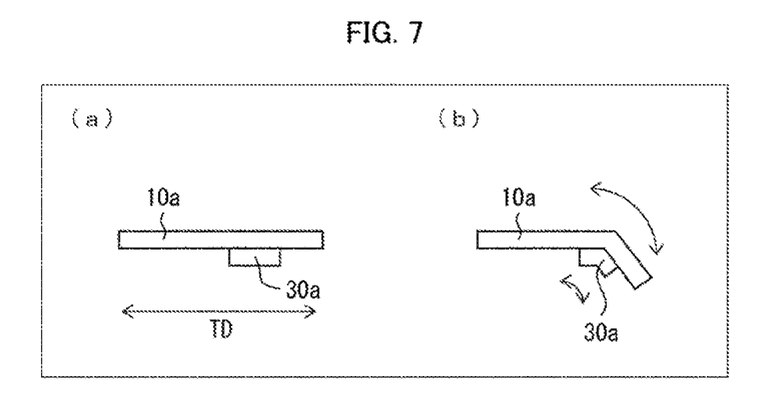
FIG. 7 is a lateral view of a portion of the component-mounted body illustrated in FIG. 6. (a) of FIG. 7 illustrates the component-mounted body prior to heating. (b) of FIG. 7 illustrates the component-mounted body after heating.

(a) of FIG. 7 illustrates the wiring substrate 10a and one of the bend assisting bodies 30a in a state prior to heating.

When the wiring substrate 10a and the bend assisting body 30a are heated, the bend assisting body 30a undergoes a lesser degree of TD axis-wise expansion than does the wiring substrate 10a, due to the difference between the thermal expansion coefficient of the bend assisting body 30a and the thermal expansion coefficient of the wiring substrate 10a along the TD axis. This causes the wiring substrate 10a to bend such that a side on which the bend assisting body 30a is provided is on the inner side of the bend (see (b) of FIG. 7).

More specifically, the bend assisting bodies 30a have a thermal expansion coefficient which is (i) less than the thermal expansion coefficient of the LCP base material 11 along the TD axis and (ii) approximately equal to the thermal expansion coefficient of the LCP base material 11 along the MD axis.

In other words, the following relational expression holds true.

(thermal expansion coefficient of bend assisting bodies 30a)≈(thermal expansion coefficient of LCP base material 11 along MD axis)<(thermal expansion coefficient of LCP base material 11 along TD axis)

Note that the thermal expansion coefficient of the bend assisting bodies 30a is isotropic.

With the above thermal expansion coefficients, the wiring substrate 10a is not deformed with respect to the MD axis because the bend assisting bodies 30a and the wiring substrate 10a have approximately equal thermal expansion coefficients along the MD axis. However, the bend assisting bodies 30a cause the wiring substrate 10a to be deformed with respect to the TD axis because the bend assisting bodies 30a have a thermal expansion coefficient which is less than that of the wiring substrate 10a along the TD axis. Specifically, at each position where one of the bend assisting bodies 30a is provided, the wiring substrate 10a is bent so as to form a straight "bending line" parallel to the MD axis, the bend assisting bodies 30a being on an inner side of each bend.

Figure 8:
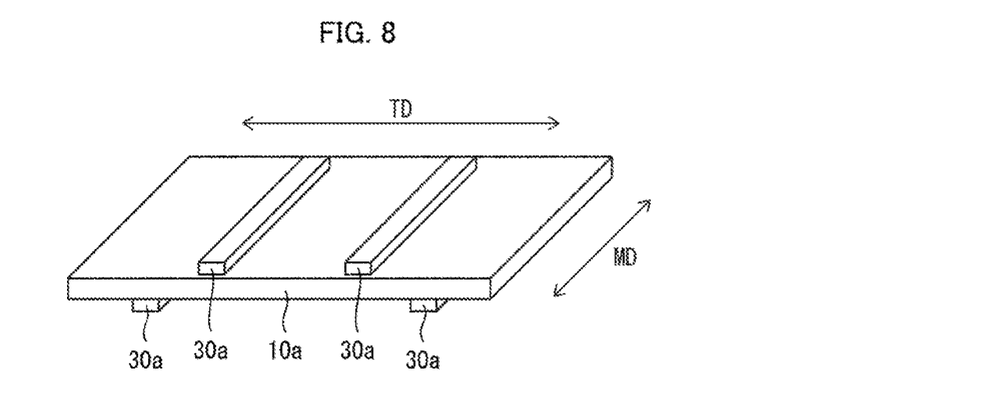
FIG. 8 is a perspective view of a portion of the component-mounted body illustrated in FIG. 1.

FIG. 8 is a perspective view of the wiring substrate 10a in a flat state, with the bend assisting bodies 30a being provided to the wiring substrate 10a. As illustrated in FIG. 8, on the wiring substrate 10a in a flat state, each of the bend assisting bodies 30a is provided, in a belt-like manner parallel to the MD axis, at a position at which the wiring substrate 10a is to bend, such that each of the bend assisting bodies 30a will be on an inner side of each bend. Providing the bend assisting bodies 30a in this manner makes it possible to form the depressed portion 14 and the adjacent portions 15 of the wiring substrate 10a by use of heating.

As an example, the LCP base material 11 can be made from a material having an MD axis thermal expansion coefficient of $2.0 \times 10^{-5}$/° C. and a TD axis thermal expansion coefficient of $8.9 \times 10^{-5}$/° C. The bend assisting bodies 30a can be made of a material having a thermal expansion coefficient of $2 \times 10^{-5}$/° C. to $4 \times 10^{-5}$/° C. LCP manufactured by Sumitomo Chemical Co., Ltd. (product no. E6006L) can be used for the LCP base material 11, and an epoxy resin manufactured by NTT Advanced Technology Corporation (product nos. AT4291A, AT9290F, AT3083, and AT3088) can be used for the bend assisting bodies 30a.

With the component-mounted body 2 of Embodiment 2, the wiring substrate 10a in a flat state can be caused to take on the three-dimensional structure concurrently with reflow, as with the component-mounted body 1 of Embodiment 1.

(Recap)

In order to solve the above-described problems, a wiring substrate in accordance with an aspect of the present invention (which wiring substrate is also referred to as a first wiring substrate) includes:

a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

wiring formed on the substrate; and at least one bend assisting body which extends in a belt-like manner parallel to the first axis of the substrate surface, a difference between (i) a thermal expansion coefficient of the at least one bend assisting body and (ii) the second thermal expansion coefficient of the substrate being greater than a difference between (i) the thermal expansion coefficient of the at least one bend assisting body and (ii) the first thermal expansion coefficient of the substrate, the substrate being bent along with each of the at least one bend assisting body so as to form a bending line which extends parallel to the first axis.

The above configuration makes it possible to provide a wiring substrate which allows bending of the wiring substrate to be carried out concurrently with reflow for mounting an electronic component to the wiring substrate.

Specifically, providing a bend assisting body which is belt-like and which satisfies the above conditions regarding thermal expansion coefficients makes it possible to bend the substrate, by use of heating, so that a bending line is formed along a straight line in which the bend assisting body extends. As such, it is possible to bend the substrate concurrently with reflow for mounting an electronic component, by using heat used for the reflow.

Particularly, with the above configuration, providing the bend assisting body which (i) extends in a belt-like manner parallel to a first axis and (ii) satisfies the above conditions regarding thermal expansion coefficients makes it possible to bend the substrate and the wiring provided thereto in a manner such that (a) a side of the substrate to which the bend assisting body is provided is on an outer side of the bend and (b) a bending line extending parallel to the first axis is formed.

In order to solve the above-described problems, another wiring substrate in accordance with an aspect of the present invention (which wiring substrate is also referred to as a second wiring substrate) includes:

a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

wiring formed on the substrate; and at least one bend assisting body which extends in a belt-like manner parallel to the second axis of the substrate surface, a difference between (i) a thermal expansion coefficient of the at least one bend assisting body and (ii) the first thermal expansion coefficient of the substrate being greater than a difference between (i) the thermal expansion coefficient of the at least one bend assisting body and (ii) the second thermal expansion coefficient of the substrate, the substrate being bent along with each of the at least one bend assisting body so as to form a bending line which extends parallel to the second axis.

The above configuration makes it possible to provide a wiring substrate which allows bending of the wiring substrate to be carried out concurrently with reflow for mounting an electronic component to the wiring substrate.

Specifically, providing a bend assisting body which is belt-like and which satisfies the above conditions regarding thermal expansion coefficients makes it possible to bend the substrate, by use of heating, so that a bending line is formed along a straight line in which the bend assisting body extends. As such, it is possible to bend the substrate concurrently with reflow for mounting an electronic component, by using heat used for the reflow.

Particularly, with the above configuration, providing the bend assisting body which (i) extends in a belt-like manner parallel to a second axis and (ii) satisfies the above conditions regarding thermal expansion coefficients makes it possible to bend the substrate and the wiring provided thereto in a manner such that (a) a side of the substrate to which the bend assisting body is provided is on an inner side of the bend and (b) a bending line extending parallel to the second axis is formed.

The first wiring substrate in accordance with an embodiment of the present invention can be configured such that:

the thermal expansion coefficient of the at least one bend assisting body is equal or substantially equal to the first thermal expansion coefficient of the substrate.

With the above configuration, a difference between the thermal expansion coefficient of the at least one bend assisting body and the first thermal expansion coefficient is either nonexistent or negligible. As such, a force which the at least one bend assisting body exerts on the substrate so as to bend the substrate with respect to the first axis is nonexistent or negligible. This makes it possible to suitably bend the substrate so as to form a bending line parallel to the first axis.

Note that the thermal expansion coefficient of the at least one bend assisting body being "substantially equal" to the first thermal expansion coefficient of the substrate means that the difference between (i) the thermal expansion coefficient of the at least one bend assisting body and (ii) the first thermal expansion coefficient of the substrate is sufficiently small compared to (i) the thermal expansion coefficient of the at least one bend assisting body or (ii) the first thermal expansion coefficient of the substrate.

The second wiring substrate in accordance with an embodiment of the present invention can be configured such that:

the thermal expansion coefficient of the at least one bend assisting body is equal or substantially equal to the second thermal expansion coefficient of the substrate.

With the above configuration, a difference between the thermal expansion coefficient of the at least one bend assisting body and the first thermal expansion coefficient is either nonexistent or negligible. As such, a force which the at least one bend assisting body exerts on the substrate so as to bend the substrate with respect to the first axis is nonexistent or negligible. This makes it possible to suitably bend the substrate so as to form a bending line parallel to the first axis.

Note that the thermal expansion coefficient of the at least one bend assisting body being "substantially equal" to the second thermal expansion coefficient of the substrate means that the difference between (i) the thermal expansion coefficient of the at least one bend assisting body and (ii) the second thermal expansion coefficient of the substrate is sufficiently small compared to (i) the thermal expansion coefficient of the at least one bend assisting body or (ii) the second thermal expansion coefficient of the substrate.

The first and second wiring substrates in accordance with an embodiment of the present invention may be configured such that:

the substrate surface of the substrate is bent at a plurality of positions such that a depressed portion is formed in the substrate;

one of the at least one bend assisting body is provided at each of the plurality of positions; and the depressed portion contains an electronic component having terminals which are soldered to the wiring.

The above configuration makes it possible to provide a wiring substrate in the form of a primary component-mounted body in which an electronic component is contained in a depressed portion of the wiring substrate.

The first and second wiring substrates in accordance with an embodiment of the present invention may be configured such that:

the substrate consists of a liquid crystal polymer;

the first axis is a transverse direction (TD) axis of the substrate; and the second axis is a machine direction (MD) axis of the substrate.

The above configuration makes it possible to provide a liquid crystal polymer substrate which enables simplification of an operation for mounting an electronic component thereto.

A method of producing a wiring substrate in accordance with an aspect of the present invention (which method is also referred to as a first method of producing a wiring substrate) includes:

forming wiring on a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

forming, on the substrate, at least one bend assisting body which extends in a belt-like manner parallel to the first axis of the substrate surface, the at least one bend assisting body having a thermal expansion coefficient such that a difference between (i) the thermal expansion coefficient of the at least one bend assisting body and (ii) the second thermal expansion coefficient of the substrate is greater than a difference between (i) the thermal expansion coefficient of the at least one bend assisting body and (ii) the first thermal expansion coefficient of the substrate; and heating the substrate and the bend assisting body after the step of forming the at least one bend assisting body, such that the substrate is bent along with each of the at least one bend assisting body so as to form a bending line which extends parallel to the first axis.

The above configuration makes it possible to provide a wiring substrate which allows bending of the wiring substrate to be carried out concurrently with reflow for mounting an electronic component to the wiring substrate.

Specifically, providing a bend assisting body which is belt-like and which satisfies the above conditions regarding thermal expansion coefficients makes it possible to bend the substrate, by use of heating, so that a bending line is formed along a straight line in which the bend assisting body extends. As such, it is possible to bend the substrate concurrently with reflow for mounting an electronic component, by using heat used for the reflow.

Particularly, with the above configuration, providing the bend assisting body which (i) extends in a belt-like manner parallel to a first axis and (ii) satisfies the above conditions regarding thermal expansion coefficients makes it possible to bend the substrate and the wiring provided thereto in a manner such that (a) a side of the substrate to which the bend assisting body is provided is on an outer side of the bend and (b) a bending line extending parallel to the first axis is formed.

Another method of producing a wiring substrate in accordance with an aspect of the present invention (which method is also referred to as a second method of producing a wiring substrate) includes the steps of:

forming wiring on a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

forming, on the substrate, at least one bend assisting body which extends in a belt-like manner parallel to the second axis of the substrate surface, the at least one bend assisting body having a thermal expansion coefficient such that a difference between (i) the thermal expansion coefficient of the at least one bend assisting body and (ii) the first thermal expansion coefficient of the substrate is greater than a difference between (i) the thermal expansion coefficient of the at least one bend assisting body and (ii) the second thermal expansion coefficient of the substrate; and heating the substrate and the bend assisting body after the step of forming the at least one bend assisting body, such that the substrate is bent along with each of the at least one bend assisting body so as to form a bending line which extends parallel to the second axis.

The above configuration makes it possible to provide a wiring substrate which allows bending of the wiring substrate to be carried out concurrently with reflow for mounting an electronic component to the wiring substrate.

Specifically, providing a bend assisting body which is belt-like and which satisfies the above conditions regarding thermal expansion coefficients makes it possible to bend the substrate, by use of heating, so that a bending line is formed along a straight line in which the bend assisting body extends. As such, it is possible to bend the substrate concurrently with reflow for mounting an electronic component, by using heat used for the reflow.

Particularly, with the above configuration, providing the bend assisting body which (i) extends in a belt-like manner parallel to a second axis and (ii) satisfies the above conditions regarding thermal expansion coefficients makes it possible to bend the substrate and the wiring provided thereto in a manner such that (a) a side of the substrate to which the bend assisting body is provided is on an inner side of the bend and (b) a bending line extending parallel to the second axis is formed.

The first and second methods of producing a wiring substrate in accordance with an embodiment of the present invention may be arranged so as to further comprise the step of:

bringing terminals of an electronic component into contact with the wiring, after the step of forming the wiring but before the step of forming the at least one bend assisting body, such that solder is between the terminals and the wiring, in which in the step of heating the substrate and the bend assisting body, the solder is heated and melted.

The above configuration makes it possible to provide a wiring substrate in the form of a primary component-mounted body in which an electronic component is contained in a depressed portion of the wiring substrate.

[Additional Remarks]

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST 1, 2 Component-mounted body (wiring substrate)
10, 10a Wiring substrate
11 LCP base material (substrate)
12 Substrate wiring layer (wiring)
13 Passivation layer
14 Depressed portion
15 Adjacent portion
20 IC chip (electronic component)
20a Lateral surface
21 Semiconductor base material
22 I/O pad (terminal)
23 Pillar (terminal)
24 Solder layer
30, 30a Bend assisting body

The invention claimed is:

1. A wiring substrate comprising: a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;

wiring formed on the substrate; and at least one bend assisting body which extends in a belt-like manner parallel to the first axis of the substrate surface, a difference between (i) a thermal expansion coefficient of the at least one bend assisting body and (ii) the second thermal expansion coefficient of the substrate being greater than a difference between (i) the thermal expansion coefficient of the at least one bend assisting body and (ii) the first thermal expansion coefficient of the substrate, the substrate being bent along with each of the at least one bend assisting body so as to form a bending line which extends parallel to the first axis.

2. The wiring substrate according to claim 1, wherein the thermal expansion coefficient of the at least one bend assisting body is equal or substantially equal to the first thermal expansion coefficient of the substrate.

3. The wiring substrate according to claim 1, wherein:
the substrate surface of the substrate is bent at a plurality of positions such that a depressed portion is formed in the substrate;
one of the at least one bend assisting body is provided at each of the plurality of positions; and
the depressed portion contains an electronic component having terminals which are soldered to the wiring.

4. The wiring substrate according to claim 1, wherein:
the substrate consists of a liquid crystal polymer;
the first axis is a transverse direction (TD) axis of the substrate; and
the second axis is a machine direction (MD) axis of the substrate.

5. A wiring substrate comprising: a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;
wiring formed on the substrate; and
at least one bend assisting body which extends in a belt-like manner parallel to the second axis of the substrate surface,
a difference between (i) a thermal expansion coefficient of the at least one bend assisting body and (ii) the first thermal expansion coefficient of the substrate being greater than a difference between (i) the thermal expansion coefficient of the at least one bend assisting body and (ii) the second thermal expansion coefficient of the substrate,
the substrate being bent along with each of the at least one bend assisting body so as to form a bending line which extends parallel to the second axis.

6. The wiring substrate according to claim 5, wherein the thermal expansion coefficient of the at least one bend assisting body is equal or substantially equal to the second thermal expansion coefficient of the substrate.

7. A method of producing a wiring substrate, the method comprising the steps of:
forming wiring on a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;
forming, on the substrate, at least one bend assisting body which extends in a belt-like manner parallel to the first axis of the substrate surface, the at least one bend assisting body having a thermal expansion coefficient such that a difference between (i) the thermal expansion coefficient of the at least one bend assisting body and (ii) the second thermal expansion coefficient of the substrate is greater than a difference between (i) the thermal expansion coefficient of the at least one bend assisting body and (ii) the first thermal expansion coefficient of the substrate; and
heating the substrate and the bend assisting body after the step of forming the at least one bend assisting body, such that the substrate is bent along with each of the at least one bend assisting body so as to form a bending line which extends parallel to the first axis.

8. The method according to claim 7, further comprising the step of:
bringing terminals of an electronic component into contact with the wiring, after the step of forming the wiring but before the step of forming the at least one bend assisting body, such that solder is between the terminals and the wiring,
wherein in the step of heating the substrate and the bend assisting body, the solder is heated and melted.

9. A method of producing a wiring substrate, the method comprising the steps of:
forming wiring on a substrate which is thermoplastic, the substrate having a first thermal expansion coefficient and a second thermal expansion coefficient, the first thermal expansion coefficient being relative to a first axis which is parallel to a substrate surface of the substrate, the second thermal expansion coefficient being relative to a second axis which (i) is parallel to the substrate surface and (ii) intersects with the first axis, the first thermal expansion coefficient being greater than the second thermal expansion coefficient;
forming, on the substrate, at least one bend assisting body which extends in a belt-like manner parallel to the second axis of the substrate surface, the at least one bend assisting body having a thermal expansion coefficient such that a difference between (i) the thermal expansion coefficient of the at least one bend assisting body and (ii) the first thermal expansion coefficient of the substrate is greater than a difference between (i) the thermal expansion coefficient of the at least one bend assisting body and (ii) the second thermal expansion coefficient of the substrate; and
heating the substrate and the bend assisting body after the step of forming the at least one bend assisting body, such that the substrate is bent along with each of the at least one bend assisting body so as to form a bending line which extends parallel to the second axis.

* * * * *